(12) United States Patent
Gregory et al.

(10) Patent No.: US 12,382,605 B2
(45) Date of Patent: Aug. 5, 2025

(54) DEVICES, SYSTEMS, AND METHODS FOR A COOLING SYSTEM

(71) Applicant: Microsoft Technology Licensing, LLC, Redmond, WA (US)

(72) Inventors: Luke Thomas Gregory, Mercer Island, WA (US); Brandon Earl Gary, Seattle, WA (US); Jason David Adrian, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 232 days.

(21) Appl. No.: 18/076,762

(22) Filed: Dec. 7, 2022

(65) Prior Publication Data
US 2024/0196562 A1 Jun. 13, 2024

(51) Int. Cl.
*H05K 7/20* (2006.01)

(52) U.S. Cl.
CPC ..... *H05K 7/20254* (2013.01); *H05K 7/20772* (2013.01)

(58) Field of Classification Search
CPC ............ H05K 7/20254; H05K 7/20772; G06F 2200/201; G06F 1/20; H01L 23/34
See application file for complete search history.

(56) References Cited

U.S. PATENT DOCUMENTS

| | | | |
|---|---|---|---|
| 8,688,288 B2 | 4/2014 | Shah et al. | |
| 10,575,438 B1 * | 2/2020 | Yatskov | H01L 23/473 |
| 10,778,118 B2 * | 9/2020 | Chung | H05K 7/1432 |
| 10,834,847 B1 * | 11/2020 | Yatskov | H05K 7/20254 |
| 11,304,340 B2 | 4/2022 | Chen et al. | |
| 11,392,184 B2 | 7/2022 | Alissa et al. | |
| 11,523,541 B2 * | 12/2022 | Dogruoz | H05K 7/20636 |
| 2011/0286175 A1 * | 11/2011 | Iyengar | G06F 1/20 361/679.47 |
| 2011/0315354 A1 | 12/2011 | Johnson | |
| 2013/0128918 A1 * | 5/2013 | Campbell | H05K 7/20836 374/57 |
| 2019/0252286 A1 * | 8/2019 | Peterson | H01L 23/427 |
| 2020/0227341 A1 | 7/2020 | Neal | |
| 2021/0092878 A1 * | 3/2021 | Gao | H05K 7/20772 |
| 2021/0112686 A1 | 4/2021 | Dogruoz | |
| 2021/0321526 A1 * | 10/2021 | Kulkarni | H05K 5/06 |

(Continued)

FOREIGN PATENT DOCUMENTS

CN 113849053 A 12/2021

OTHER PUBLICATIONS

Fu, et al., "GPU Domain Specialization via Composable On-Package Architecture", In Journal of ACM Transactions on Architecture and Code Optimization, vol. 19, Issue. 1, Dec. 6, 2021, 23 Pages.

(Continued)

*Primary Examiner* — Stephen S Sul
(74) *Attorney, Agent, or Firm* — Ray Quinney & Nebeker P.C.; Paul N. Taylor (57) ABSTRACT

A cooling system may include a first domain having a first fluid inlet and a first fluid outlet. A cooling system may include a second domain having a second fluid inlet and a second fluid outlet. A cooling system may include a thermal break between the first domain and the second domain. The thermal break includes a thermal gap separating the first domain and the second domain by 1 mm or less.

20 Claims, 8 Drawing Sheets

(56) References Cited

U.S. PATENT DOCUMENTS

2021/0410292 A1    12/2021  Yang et al.
2022/0201896 A1*  6/2022  Edmunds ........... H05K 7/20263
2023/0337406 A1*  10/2023  Bawa ................... H05K 7/2099
2024/0188251 A1*  6/2024  Lee .................... H05K 7/20254

OTHER PUBLICATIONS

Son, et al., "Design and Analysis of Thermal Transmission Line based Embedded Cooling Structures for High Bandwidth Memory Module and 2.5D/3D ICs", In Proceedings of the IEEE Electrical Design of Advanced Packaging and Systems (EDAPS), Dec. 14, 2020, 3 Pages.
International Search Report and Written Opinion received for PCT Application No. PCT/US23/081024, May 8, 2024, 18 pages.
Invitation to Pay Additional Fees received for PCT Application No. PCT/US23/081024, Mar. 14, 2024, 11 pages.

* cited by examiner

DEVICES, SYSTEMS, AND METHODS FOR A COOLING SYSTEM

CROSS-REFERENCE TO RELATED APPLICATIONS

N/A.

BACKGROUND

Computing devices can generate a large amount of heat during use. The computing components can be susceptible to damage from the heat and commonly require cooling systems to maintain the component temperatures in a safe range during heavy processing or usage loads. Different computing demands and applications produce different amounts of thermal energy and require different amounts of thermal management.

BRIEF SUMMARY

In some aspects, the techniques described herein relate to a cold plate for use on a computing device. The cold plate includes a first domain having a first fluid inlet and a first fluid outlet. A second domain has a second fluid inlet and a second fluid outlet. A thermal break is located between the first domain and the second domain. The thermal break includes a thermal gap separating the first domain and the second domain by 1 mm or less.

In some aspects, the techniques described herein relate to a computing system. The computing system includes a plurality of heat-generating components secured to a base. Each heat-generating component of the plurality of heat-generating components has a different heat generation. A cold plate includes a plurality of domains. Each domain is associated with a heat-generating component of the plurality of heat-generating components. A thermal break is located between two of the plurality of domains. The thermal break includes an insulating material.

In some aspects, the techniques described herein relate to a method for cooling a computing device. The method includes providing a first cooling fluid to a first domain of a cold plate. The first domain thermally connected to a first heat-generating component. The cooling system provides a second cooling fluid to a second domain of the cold plate. The second domain is thermally connected to a second heat-generating component. A thermal gradient is maintained across a thermal break between the first domain and the second domain. The thermal gradient is located across a thermal gap of 1 mm or less between the first domain and the second domain.

This summary is provided to introduce a selection of concepts that are further described below in the detailed description. This summary is not intended to identify key or essential features of the claimed subject matter, nor is it intended to be used as an aid in limiting the scope of the claimed subject matter.

Additional features and advantages of embodiments of the disclosure will be set forth in the description which follows, and in part will be obvious from the description, or may be learned by the practice of such embodiments. The features and advantages of such embodiments may be realized and obtained by means of the instruments and combinations particularly pointed out in the appended claims. These and other features will become more fully apparent from the following description and appended claims, or may be learned by the practice of such embodiments as set forth hereinafter.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which:

FIG. 3-1 is a schematic representation of a computing system, according to at least one embodiment of the present disclosure;

FIG. 3-2 is a schematic side-view of the computing system of FIG. 3-1, according to at least one embodiment of the present disclosure;

FIG. 4-1 is a schematic representation of a computing system, according to at least one embodiment of the present disclosure;

FIG. 4-2 is a schematic side-view of the computing system of FIG. 4-1, according to at least one embodiment of the present disclosure;

DETAILED DESCRIPTION

This disclosure generally relates to devices, systems, and methods for cooling a computing device. A computing device may include multiple components that generate heat. For example, a computing device may include a processor and memory. The processor and memory may each have different power requirements, or may consume different amounts of power. This may result in the processor and memory generating different amounts of heat or having a different heat generation. In some situations, the differing heat generation may result in high temperature differences, including temperature differences of up to 60° C. In some situations, a cooling system may provide a cooling capacity that is based on the hottest computing component. This may result in excess cooling for the computing components that consume less power and/or generate less heat. Excess cooling may increase cooling operating costs for a computing device and/or a computing center including multiple computing devices.

In accordance with at least one embodiment of the present disclosure, a cooling system may include a cold plate connected to a computing device. The cold plate may include multiple different domains. Each domain may have a different cooling capacity, and adjacent domains may cool heat-generating components having a large difference in heat generation and/or operating temperature. This may allow the cooling system to provide customized cooling that is tailored to the heat generation of each computing component of the computing device, including different heat generations of different computing components. Adding different domains may moderately increase capital expenditures. In this manner, the cooling systems described herein may help to reduce cooling operating costs by a greater amount than the increase in capital expenditure.

In some embodiments, the domains of the cold plate may be separated by a thermal break. The thermal break may insulate the different domains of the cold plate, thereby reducing heat transfer between the domains. This may help to maintain the different cooling temperatures in the different domains. In this manner, the thermal break may allow computing components having a higher operating temperature to be cooled using a warmer cooling fluid. This may help to reduce the cooling operating costs by reducing the amount of chilled cooling fluid used at the cold plate.

In accordance with at least one embodiment of the present disclosure, the cooling systems discussed herein may be used in association with any computing system. For example, a cold plate including multiple domains may be used on a server installed on a blade in a rack. One or more servers on the rack and/or in the datacenter may include a cold plate having multiple domains. The fluid sources for the cold plates may be shared in the data center. Adding additional tubing and fluid management systems in a datacenter may increase the capital expenditure for the datacenter. But, as discussed herein, by reducing amount of cooling fluid chilled for a cooling system, the overall cooling operating costs may be reduced. In some embodiments, the reduction in operating costs may, over time, be greater than the increase in capital expenditures. In some embodiments, the cooling systems discussed herein may be used in any other type of computing device. For example, a cold plate including multiple domains may be used on a personal computer, such as a desktop computer or a laptop computer.

As illustrated by the foregoing discussion, the present disclosure utilizes a variety of terms to describe features and advantages of the cooling system. Additional detail is now provided regarding the meaning of such terms. For example, as used herein, the term "heat-generating component" refers to any component of a computing system that generates heat. To illustrate, a heat-generating component can include processors, circuits, integrated circuits (ICs), application-specific integrated circuits (ASIC), switches, transistors, field-programmable gate arrays (FPGAs), antennas, receivers, memory, random-access memory (RAM), dynamic random-access memory (DRAM), static random-access memory (SRAM), read-only memory (ROM), dual in-line memory modules (DIMMs), high density memory (HDM), energy storage devices, batteries, supercapacitors, any other heat-generating component, and combinations thereof. A heat-generating component that generates more heat may be associated with a higher-performing heat-generating component. For example, a faster heat-generating component may generate more total heat. In some examples, a smaller heat-generating component may have a higher heat flux, resulting in a higher rate of cooling to maintain operating temperatures.

As used herein, the term "thermally connected" refers to a connection between two components that facilitates the transfer of heat between the two components. Two thermally connected components may be in direct contact (e.g., without any intervening material). Two thermally connected components may have one or more thermal connectors between them. The thermal connector may be a thermally conductive material, or a material that facilitates the transfer of heat through its mass.

As used herein, a "cooling fluid" may be any fluid used in a cooling system. A cooling fluid may be used to cool a heat-generating component. In some embodiments, the cooling fluid is thermally connected to the heat-generating component. For example, the cooling fluid may be flowed through one or more pipes, conduits, tubes, or other fluid transfer systems. The cooling fluid may include any type of fluid. For example, the cooling fluid may include water or a water-based fluid. In some examples, the cooling fluid may include oil or an oil-based fluid.

Figure 1:
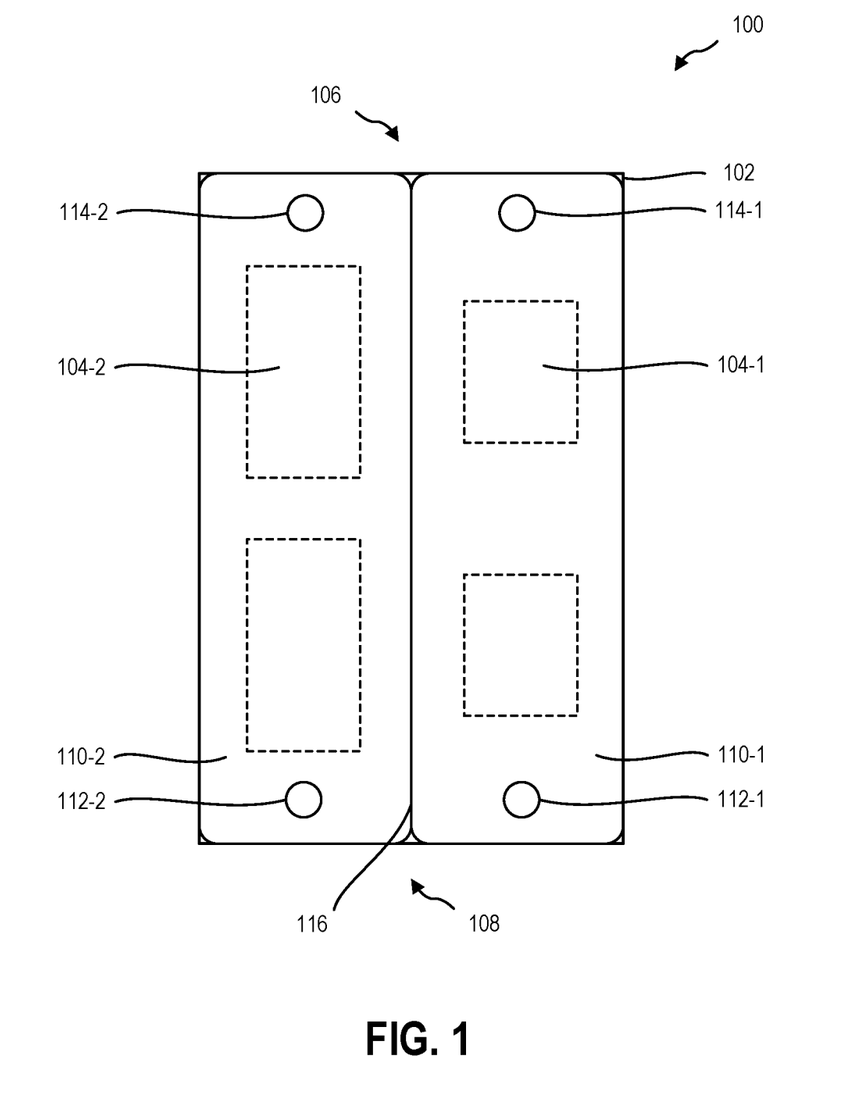
FIG. 1 is a representation of a computing system, according to at least one embodiment of the present disclosure.

FIG. 1 is a representation of a computing system 100, according to at least one embodiment of the present disclosure. The computing system 100 includes a base 102. A plurality of heat-generating components (collectively 104) are connected to the base 102. In the embodiment shown, the computing system 100 includes a first heat-generating component 104-1 and a second heat-generating component 104-2. The first heat-generating component 104-1 and the second heat-generating component 104-2 may be different. For example, the first heat-generating component 104-1 may be a processor and the second heat-generating component 104-2 may be memory. For example, the second heat-generating component 104-2 may be high-bandwidth memory (HBM).

The first heat-generating component 104-1 and the second heat-generating component 104-2 may consume different amounts of power, or may have different power consumptions. In some situations, the power consumption may be related to the heat generation of the heat-generating components. For example, a higher power consumption may be associated with a higher heat generation and a lower power consumption may be associated with a lower heat generation. In some embodiments, the first heat-generating component 104-1 and the second heat-generating component 104-2 have different heat generation. For example, the first heat-generating component 104-1 may generate more or less heat than the second heat-generating component 104-2. In some examples, the first heat-generating component 104-1 and the second heat-generating component 104-2 may consume the same amount of power while the first heat-generating component 104-1 generates a different amount of heat than the second heat-generating component 104-2.

Computing devices may have an operating temperature. At temperatures above the operating temperature, the computing device may operate with a lower efficiency, be damaged, have a shorter operating life, break, experience other damage, and combinations thereof. To maintain the heat-generating components at or below the operating temperature, the computing system 100 may include a cooling system 106. The cooling system 106 may provide cooling for the computing system 100.

The cooling system 106 may include a cold plate 108. The cold plate 108 may include multiple domains (collectively 110). In the embodiment shown, the cold plate 108 includes a first domain 110-1 and a second domain 110-2. The domains 110 of the cold plate 108 may be associated with or thermally connected to different heat-generating components 104. For example, the first domain 110-1 may be thermally connected to the first heat-generating component 104-1 and the second domain 110-2 may be thermally connected to the second heat-generating component 104-2.

In this manner, the first heat-generating component 104-1 may transfer heat to the first domain 110-1 of the cold plate 108 and the second heat-generating component 104-2 may transfer heat to the second domain 110-2 of the cold plate 108. The cold plate 108 may remove the transferred heat away from the computing system 100, thereby cooling the heat generating components 104.

The cooling system 106 may be a fluid-cooled cooling system 106. For example, the cold plate 108 may have a cooling fluid flow through the cold plate 108. The cooling fluid may absorb the heat transferred by the heat-generating components 104, thereby warming the cooling fluid. As the warmed cooling fluid is flowed through the cold plate 108, the warmed cooling fluid may move the heat out of the cold plate 108 and away from the computing system 100. This may help to cool the heat-generating components 104. In some embodiments, the temperature of the cooling fluid is associated with a cooling capacity of the cooling system 106. For example, a colder cooling fluid may be able to absorb more heat from the heat-generating components 104, or have a higher cooling capacity.

Conventionally, a computing system 100 may include a single cold plate 108 having a single domain. This may cool all of the heat-generating components 104 to the same temperature. For example, the cold plate 108 may have the same cooling fluid at the same temperature flowing through the cold plate 108. An operator may prepare a cold plate 108 having a cooling capacity that is based on the heat-generating component 104 having the highest heat generation. This may result in one or more of the heat-generating components 104 being cooled below their operating temperature. Cooling heat-generating components 104 below their operating temperature may increase the cooling operating costs of the computing system 100.

In accordance with at least one embodiment of the present disclosure, the different domains 110 of the cold plate 108 may cool each of the heat-generating components 104 to their operating temperature. For example, the first domain 110-1 may cool the first heat-generating component 104-1 to a first operating temperature and the second domain 110-2 may cool the second heat-generating component 104-2 to a second operating temperature. The first operating temperature of the first heat-generating component 104-1 may be different than the second operating temperature of the second heat-generating component 104-2. This may help to reduce cooling operating costs.

As discussed herein, the cold plate 108 may flow a cooling fluid through the cold plate 108 to cool the heat-generating components 104. In the embodiment shown, a different flow of cooling fluid is flowed through each of the domains 110. For example, a first flow of a first cooling fluid is flowed through the first domain 110-1 and a second flow of a second cooling fluid is flowed through the second domain 110-2. The first flow of the first cooling fluid may be flowed into the first domain 110-1 through a first inlet 112-1 and out of the first domain 110-1 through a first outlet 114-1. The second flow of the second cooling fluid may be flowed into the second domain 110-2 through a second inlet 112-2 and out of the second domain 110-2 through a second outlet 114-2.

The first inlet 112-1 may be fluidly connected to a first cooling fluid source and the second outlet 114-2 may be fluidly connected to a second cooling fluid source. This may allow the first cooling fluid to have a different cooling capacity than the second cooling fluid. For example, the first cooling fluid may have a different temperature than the second cooling fluid. In some examples, the first cooling fluid may be a different type of cooling fluid than the second cooling fluid. In some examples, the first cooling fluid may be flowed through the first domain 110-1 with a different flow rate (e.g., volumetric flow rate, fluid velocity, fluid pressure) than the second cooling fluid is flowed through the second domain 110-2.

The cooling capacity of the domains 110 may be based on the heat generation of the heat-generating components 104. For example, the first heat-generating component 104-1 may generate less heat and/or have a higher operating temperature than the second heat-generating component 104-2. The first domain 110-1 may have a lower cooling capacity than the second domain 110-2. For example, the first cooling fluid may have a higher temperature than the second cooling fluid. In some examples, the second cooling fluid may be chilled. The first cooling fluid may be not be chilled (e.g., the first cooling fluid may be unchilled) or may be chilled to a lower temperature than the second cooling fluid. In some examples, the first cooling fluid may be tap water, process water, waste water from other applications, provided from another unchilled fluid source, and combinations thereof. The process of chilling cooling fluid may be expensive, and using unchilled cooling fluid may help to lower cooling operating costs. In some embodiments, using unchilled cooling fluid for heat-generating components 104 having a lower heat generation and/or higher operating temperature may lower the chilling operating costs of the computing system 100 by up to 3 times.

The first heat-generating component 104-1 may have a first operating temperature that is a temperature difference than a second operating temperature of the second heat-generating component 104-2. In some embodiments, the temperature difference may be in a range having an upper value, a lower value, or upper and lower values including any of 5° C., 10° C., 15° C., 20° C., 25° C., 30° C., 35° C., 40° C., 45° C., 50° C., 55° C., 60° C., 65° C., 70° C., or any value therebetween. For example, the temperature difference may be greater than 5° C. In another example, the temperature difference may be less than 70° C. In yet other examples, the temperature difference may be any value in a range between 5° C. and 70° C. In some embodiments, it may be critical that the temperature difference is approximately 25° C. to improve the cost savings by utilizing different cooling fluids in different domains 110.

The first cooling fluid may have a first cooling temperature that is a cooling fluid temperature difference than a second cooling temperature of the second cooling fluid. In some embodiments, the temperature difference may be in a range having an upper value, a lower value, or upper and lower values including any of 5° C., 10° C., 15° C., 20° C., 25° C., 30° C., 35° C., 40° C., 45° C., 50° C., 55° C., 60° C., 65° C., 70° C., or any value therebetween. For example, the cooling fluid temperature difference may be greater than 5° C. In another example, the cooling fluid temperature difference may be less than 70° C. In yet other examples, the cooling fluid temperature difference may be any value in a range between 5° C. and 70° C. In some embodiments, it may be critical that the cooling fluid temperature difference is approximately 20° C. to improve the cost savings by utilizing different cooling fluids in different domains 110.

In accordance with at least one embodiment of the present disclosure, the first domain 110-1 may be insulated from the second domain 110-2. For example, the first domain 110-1 may not be thermally connected to the second domain 110-2. The first domain 110-1 may be separated from the second domain 110-2 with a thermal break 116. The thermal break 116 may thermally separate the first domain 110-1 from the second domain 110-2. This may help to reduce or prevent heat transfer between the first domain 110-1 and the second domain 110-2. For example, the first cooling temperature of the first cooling fluid of the first domain 110-1 may be larger than the second cooling temperature of the second cooling fluid of the second domain 110-2. Heat from the first cooling fluid may transfer to the second domain 110-2, thereby reducing the cooling effectiveness of the second domain 110-2. The thermal break 116 may reduce or prevent the transfer of heat between the domains 110. In this manner, the temperature difference and/or the cooling fluid temperature difference may be greater and/or have a lower impact on the cooling capacity of the cooling system 106. This may help to further reduce cooling operating costs by allowing a larger temperature difference and/or cooling temperature difference.

Figure 2:
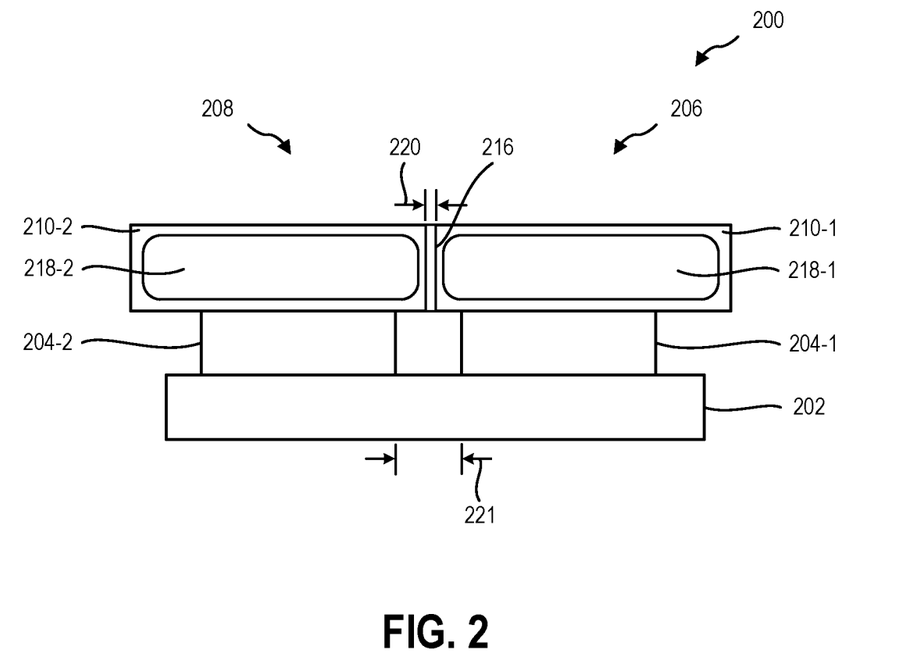
FIG. 2 is a schematic representation of a side-view of a cooling system, according to at least one embodiment of the present disclosure.

FIG. 2 is a schematic representation of a side-view of a cooling system 200, according to at least one embodiment of the present disclosure. The cooling system 200 shown includes a base 202, heat-generating components (collectively 204), and a cooling system 206 thermally connected to the heat-generating components 204. The cooling system 206 includes a cold plate 208 having multiple domains (collectively 210). The cold plate 208 includes a first domain 210-1 thermally connected to a first heat-generating component 204-1 and a second domain 210-2 thermally connected to a second heat-generating component 204-2. A first cooling fluid may flow through a first channel 218-1 in the first domain 210-1 and a second cooling fluid may flow through a second channel 218-2 in the second domain 210-2.

As discussed herein, the first heat-generating component 204-1 may have a different heat generation and/or operating temperature than the second heat-generating component 204-2. To cool the heat-generating components 204, a first cooling capacity of the first domain 210-1 may be different than a second cooling capacity of the second domain 210-2. For example, a first cooling temperature of the first cooling fluid in a first channel 218-1 may be different than a second cooling temperature of the second cooling fluid in a second channel 218-2. This may result in the temperature of the first domain 210-1 being different than the temperature of the second domain 210-2.

Different temperatures of domains 210 may cause heat transfer between the domains 210. This may reduce the effectiveness of the domain 210 having the higher cooling capacity. For example, heat transfer between the domains 210 may increase the temperature of the domain 210 having the lower cooling temperature.

In accordance with at least one embodiment of the present disclosure, the first domain 210-1 may be thermally separated from the second domain 210-2 with a thermal break 216. The thermal break 216 may reduce or prevent heat transfer between domains 210. For example, the thermal break 216 may reduce or prevent heat transfer from the warmer of the domains 210 to the colder of the domains 210. This may help to increase the cooling effectiveness of the colder of the domains 210.

The thermal break 216 may be formed from an insulating material. The insulating material of the thermal break 216 may be any type of insulating material. For example, the insulating material may include a ceramic material, a metal (e.g., copper, steel, stainless steel), a metallic alloy, a liquid, a gas (e.g., atmospheric air, nitrogen), silicon glass, carbon fiber, fiberglass mesh, neoprene, any other insulating material having a moderate to high thermal resistance value, and combinations thereof. In some embodiments, the thermal break 216 may be formed from multiple insulating materials. For example, the thermal break 216 may be formed from layers and/or composites of insulating materials.

In some embodiments, the thermal break 216 may be formed in a thermal gap. The thermal gap may have a gap width 220. Conventionally, a smaller distance between two heat-generating components may result in more heat transfer between the heat-generating components. When a first heat-generating component having a higher operating temperature is located adjacent a second heat-generating component having a lower operating temperature, heat from the first heat-generating component may raise the temperature of the second heat-generating component, potentially reducing the operation of the second heat-generating component. In other words, a larger distance between two heat-generating components is desirable. But, as may be understood, the proximity of the heat-generating components 204 and their associated domains 210 may be based on the geometry of the computing device.

The gap width 220 of the thermal gap may be the distance between the first domain 210-1 and the second domain 210-2. In some embodiments, the gap width 220 may be sized based on the dimensions of the cooling system 200. For example, the gap width 220 may be the width between the first heat-generating component 204-1 and the second heat-generating component 204-2. In some embodiments, the gap width 220 may be less than the distance between the first heat-generating component 204-1 and the second heat-generating component 204-2. In some embodiments, the gap width 220 may be in a range having an upper value, a lower value, or upper and lower values including any of 0.8 mm, 0.9 mm, 1.0 mm, 1.5 mm, 2.0 mm, or any value therebetween. For example, the gap width 220 may be greater than 0.8 mm. In another example, the gap width 220 may be less than 2.0 mm. In yet other examples, the gap width 220 may be any value in a range between 0.8 mm and 2.0 mm. In some embodiments, it may be critical that the gap width 220 is 1 mm or less to allow the domains 210 to be located adjacent each other while individually cooling the heat-generating components 204. In some embodiments, the gap width 220 of the thermal gap may be entirely filled with the insulating material. In some embodiments, the gap width 220 of the thermal gap may be partially filled with the insulating material.

The heat-generating components 204 have a component distance 221 between them. For example, the first heat-generating component 204-1 may be separated from the second heat-generating component 204-2 by the component distance 221. In some embodiments, the component distance 221 may be in a range having an upper value, a lower value, or upper and lower values including any of 0.1 mm, 0.2 mm, 0.3 mm, 0.4 mm, 0.5 mm, 0.6 mm, 0.7 mm, 0.8 mm, 0.9 mm, 1.0 mm, 1.5 mm, 2.0 mm, or any value therebetween. For example, the component distance 221 may be greater than 0.1 mm. In another example, the component distance 221 may be less than 2.0 mm. In some examples, the component distance 221 may be greater than 2.0 mm. In yet other examples, the component distance 221 may be any value in a range between 0.1 mm and 2.0 mm. In some embodiments, it may be critical that the component distance 221 is 1 mm or less to allow the domains 210 to be located adjacent each other while individually cooling the heat-generating components 204. As discussed herein, in some embodiments, the component distance 221 may be the same as the gap width 220. In some embodiments, the component distance 221 may be larger than the gap width 220. In some embodiments, the component distance 221 may be smaller than the gap width 220.

The domains 210 have a thermal gradient between them. The thermal gradient may have a difference in temperature over a distance. In some embodiments, the thermal gradient may be in a range having an upper value, a lower value, or upper and lower values including any of 5° C./mm, 10° C./mm, 15° C./mm, 20° C./mm, 25° C./mm, 30° C./mm, 35° C./mm, 40° C./mm, 45° C./mm, 50° C./mm, 55° C./mm, 60° C./mm, 65° C./mm, 70° C./mm, 75° C./mm, 80° C./mm, 85° C./mm, or any value therebetween. For example, the thermal gradient may be greater than 5° C./mm. In another example, the thermal gradient may be less than 85° C./mm. In yet other examples, the thermal gradient may be any value in a range between 5° C./mm and 85° C./mm. In some embodiments, it may be critical that the thermal gradient is greater than 30° C./mm to increase the cooling operating cost savings of utilizing different cooling capacities for different domains 210.

The thermal break 216 has a thermal resistance. The thermal resistance may be the resistance to heat transfer of the thermal break 216. For example, the thermal resistance may be the resistance to heat transfer between the first domain 210-1 and the second domain 210-2 across the thermal break 216. In some embodiments, the thermal resistance may be in a range having an upper value, a lower value, or upper and lower values including any of 0.001 w/mk, 0.005 w/mk, 0.01 w/mk, 0.02 w/mk, 0.03 w/mk, 0.04 w/mk, 0.05 w/mk, 0.06 w/mk, 0.07 w/mk, 0.08 w/mk, 0.09 w/mk, 0.10 w/mk, or any value therebetween. For example, the thermal resistance may be greater than 0.001° w/mk. In another example, the thermal resistance may be less than 0.10 w/mk. In yet other examples, the thermal resistance may be any value in a range between 0.001° w/mk and 0.10 w/mk. In some embodiments, it may be critical that the thermal resistance is approximately 0.01 w/mk to reduce the heat flow between the domains 210.

In some embodiments, the domains 210 are physically connected. For example, the first domain 210-1 may be physically connected to the second domain 210-2. For example, the first domain 210-1 may be connected to the second domain 210-2 with one or more mechanical fasteners, such as screws, bolts, or mechanical fascinators. In some examples, the first domain 210-1 may be connected to the second domain 210-2 with an adhesive. In some examples, the first domain 210-1 may be connected to the second domain 210-2 with a brazed connection. In some examples, the first domain 210-1 may be connected to the second domain 210-2 with any type of connection.

In some embodiments, the domains 210 may be connected through the thermal break 216. For example, the first domain 210-1 may be connected to the thermal break 216, and the second domain 210-2 may be connected to the thermal break 216. The domains 210 may be connected to the thermal break 216 in any manner. For example, the first domain 210-1 and the second domain 210-2 may be connected to the thermal break 216 with a mechanical fastener, an adhesive, a brazed connection, any other type of connection, and combinations thereof. In some examples, the first domain 210-1 and the second domain 210-2 may be connected to the thermal break 216 with the same connection type. In some examples, the first domain 210-1 and the second domain 210-2 may be connected to the thermal break 216 with different connection types.

In some embodiments, the domains 210 are not physically connected. For example, the domains 210 may be independently connected to the cooling system 200. In some embodiments, the domains 210 abut the thermal break 216 without being physically connected. This may allow for relative motion between one or more of the first domain 210-1, the second domain 210-2, and the thermal break 216, such as changes in size based on differences in thermal expansion. In some embodiments, the thermal break 216 may be air, and the domains 210 may not contact and be separated with an air gap. This may allow for relative motion between the first domain 210-1 and the second domain 210-2, such as changes in size based on differences in thermal expansion.

In accordance with at least one embodiment of the present disclosure, the cooling system 200 may include a first domain 210-1 and a second domain 210-2 separated by a gap width 220 of less than 1 mm. The first heat-generating component 204-1 and the second heat-generating component 204-2 may be separated by a component distance 221 of less than 1 mm. A temperature difference between the first heat-generating component 204-1 and the second heat-generating component 204-2 may be greater than 50° C. A fluid difference between the first cooling fluid of the first domain 210-1 and the second cooling fluid of the second domain 210-2 may be greater than 50° C. A thermal gradient between the first domain 210-1 and the second domain 210-2 may be greater than 1° C./mm. This may help to allow the domains 210 to provide separate cooling for their respective heat-generating components 204.

Figure 31:
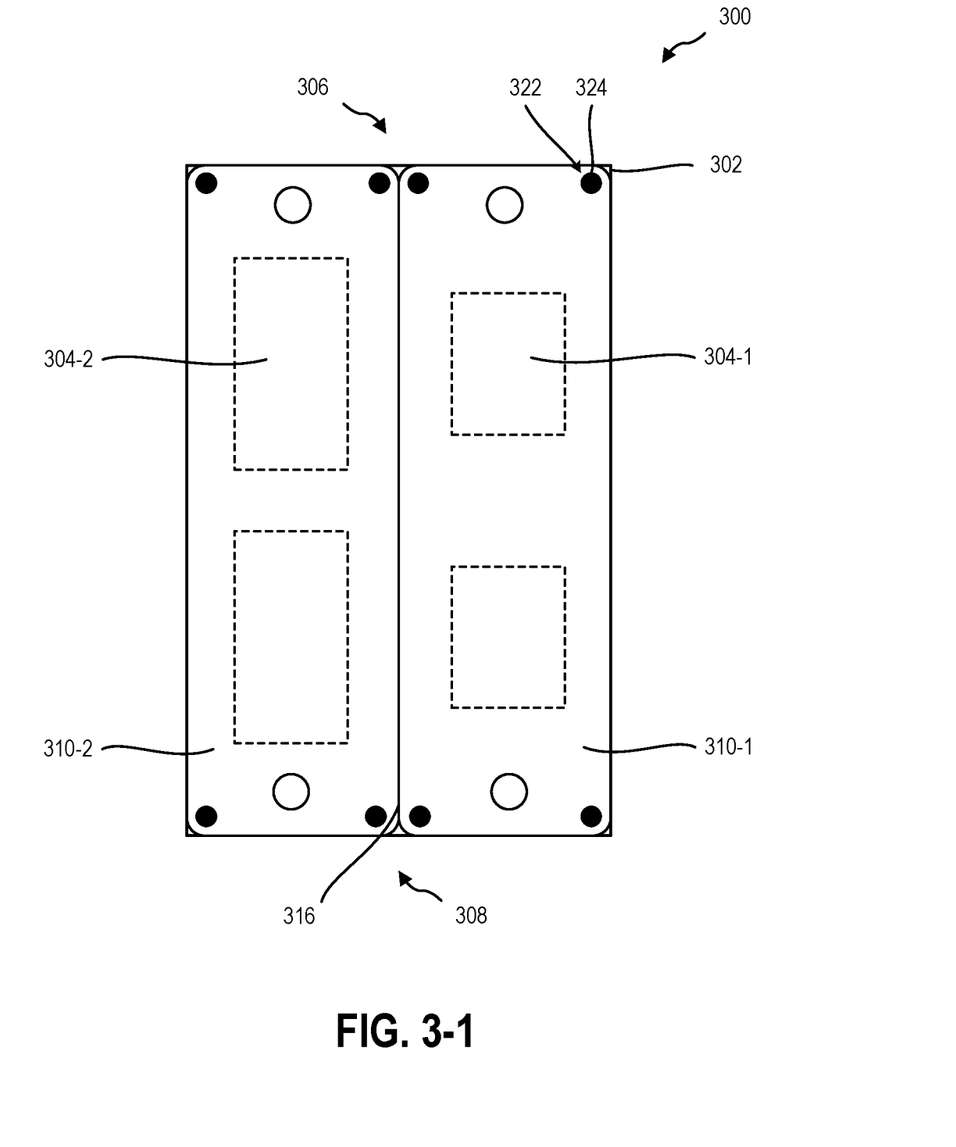

FIG. 3-1 is a schematic representation of a top-down view of a cooling system 300, according to at least one embodiment of the present disclosure. The cooling system 300 shown includes a base 302, heat-generating components (collectively 304), and a cooling system 306 thermally connected to the heat-generating components 304. The cooling system 306 includes a cold plate 308 having multiple domains (collectively 310). The cold plate 308 includes a first domain 310-1 thermally connected to a first heat-generating component 304-1 and a second domain 310-2 thermally connected to a second heat-generating component 304-2. A first cooling fluid may flow through a first channel 318-1 in the first domain 310-1 and a second cooling fluid may flow through a second channel 318-2 in the second domain 310-2. The first domain 310-1 and the second domain 310-2 may be separated by a thermal break 316.

The cold plate 308 is secured to the heat-generating components 304 and/or the base 302. The cold plate 308 may be secured to the heat-generating components 304 and/or the base 302 in any way. In the embodiment shown, the cold plate 308 is connected to the base 302 with a bolted connection 322 including mechanical fasteners 324. The mechanical fasteners 324 may include any type of mechanical fastener. For example, the mechanical fasteners 324 may include a bolt, a screw, a post, a peg, any other mechanical fastener, and combinations thereof.

The bolted connection 322 may include multiple mechanical fasteners 324. As discussed herein, the cold plate 308 may be a single structure including the first domain 310-1 and the second domain 310-2. For example, the cold plate 308 may include a chassis to which the domains 310 are connected. The chassis may be secured to the base 302 using the bolted connection 322. In some embodiments, a single bolted connection 322 may secure the cold plate 308 and the chassis of the cold plate 308, including the first domain 310-1 and the second domain 310-2, to the base 302. In some embodiments, the domains 310 are separately connected to the base 302. For example, the first domain 310-1 may include a first set of mechanical fasteners 324. The first set of mechanical fasteners 324 may secure the first domain 310-1 to the base 302. In some examples, the second domain 310-2 may include a second set of mechanical fasteners 324. The second set of mechanical fasteners 324 may secure the second domain 310-2 to the base 302 independently of the first domain 310-1. Separately securing the first domain 310-1 and the second domain 310-2 to the base 302 may help to reduce stress and/or strain on the cold plate 308 caused by differential thermal expansion and/or contraction of the domains 310.

Figure 32:
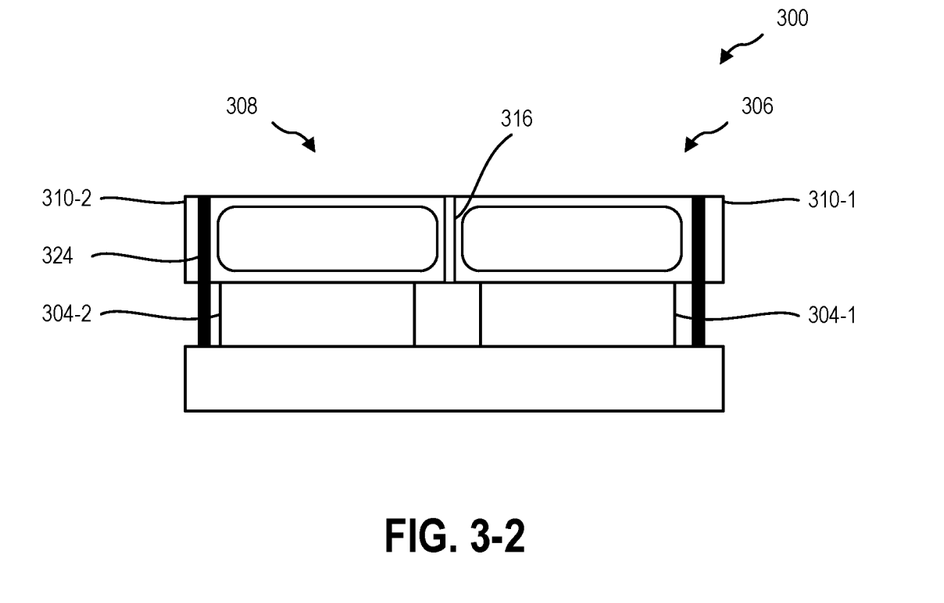

FIG. 3-2 is a schematic side-view of the cooling system 300 of FIG. 3-1. As may be seen, the mechanical fasteners 324 may secure the domains 310 to the base 302. For example, the mechanical fasteners 324 may extend from the domains 310 and into the base 302. The mechanical fasteners 324 may be tightened to secure the cold plate 308 to the base 302. This may help to prevent movement of the cold plate 308 during operation of the cooling system 300.

Figure 41:
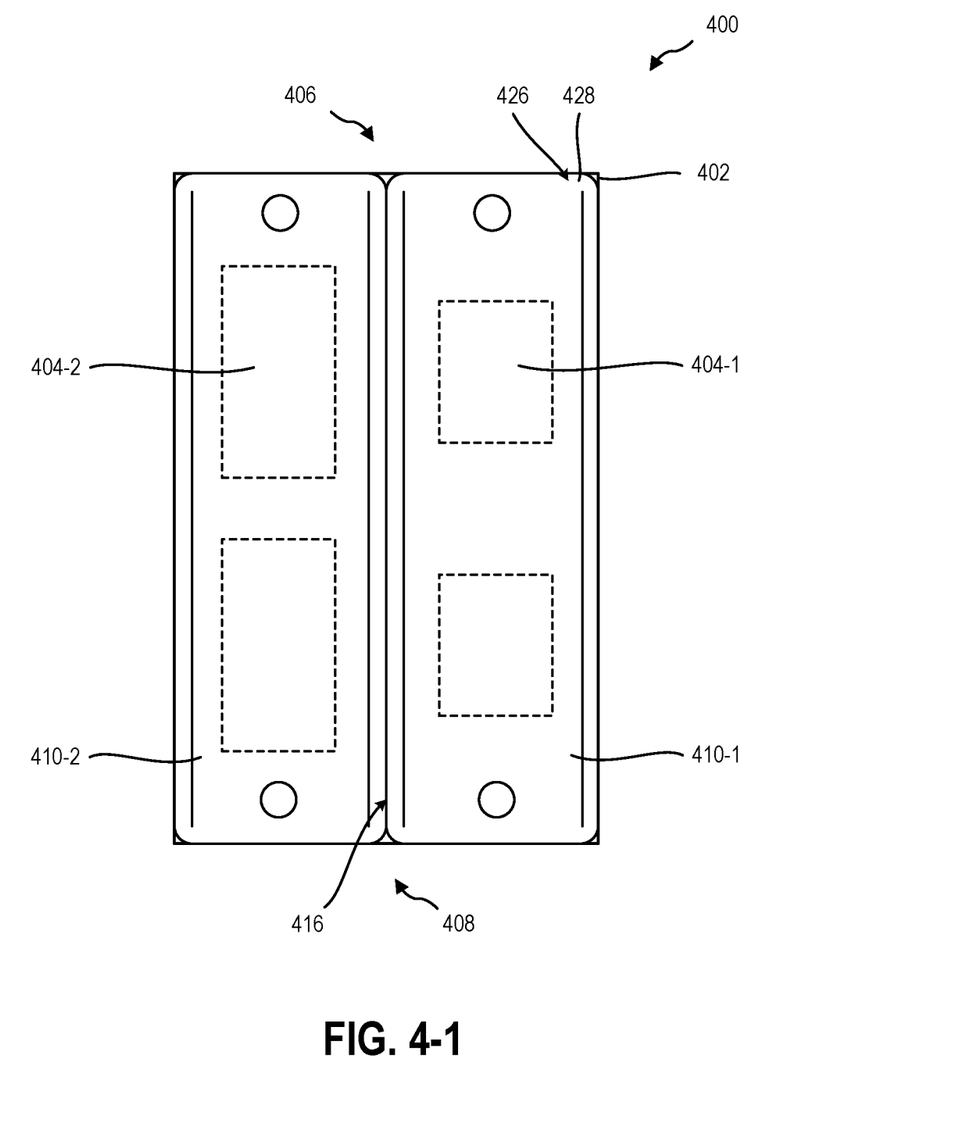

FIG. 4-1 is a schematic representation of a top-down view of a cooling system 400, according to at least one embodiment of the present disclosure. The cooling system 400 shown includes a base 402, heat-generating components (collectively 404), and a cooling system 406 thermally connected to the heat-generating components 404. The cooling system 406 includes a cold plate 408 having multiple domains (collectively 410). The cold plate 408 includes a first domain 410-1 thermally connected to a first heat-generating component 404-1 and a second domain 410-2 thermally connected to a second heat-generating component 404-2. A first cooling fluid may flow through a first channel 418-1 in the first domain 410-1 and a second cooling fluid may flow through a second channel 418-2 in the second domain 410-2. The first domain 410-1 and the second domain 410-2 may be separated by a thermal break 416.

The cold plate 408 may be connected or secured to the heat-generating components 404 and/or the base 402 with a fixture 426. The fixture 426 may include one or more plate supports 428. The plate supports 428 may support the cold plate 408 and connect the cold plate 408 to the base 402. For example, the one or more plate supports 428 may include a rail that the cold plate 408 slides on to. In some examples, the one or more plate supports 428 may include a snap connection, a friction fit connection, an interference fit connection, any other type of connection, and combinations thereof.

In some embodiments, the cold plate 408 includes a chassis to which the first domain 410-1 and the second domain 410-2 are connected. The chassis of the cold plate 408 may be secured to the base 402 using the fixture 426. In some embodiments, the first domain 410-1 and the second domain 410-2 are independently secured to the base 402 using separate fixtures 426. For example, the first domain 410-1 may include a first plate support 428. The first plate support 428 may secure the first domain 410-1 to the base 402. In some examples, the second domain 410-2 may include a second plate support 428. The second plate support 428 may secure the second domain 410-2 to the base 402 independently of the first domain 410-1. Separately securing the first domain 410-1 and the second domain 410-2 to the base 402 may help to reduce stress and/or strain on the cold plate 408 caused by differential thermal expansion and/or contraction of the domains 410.

Figure 42:
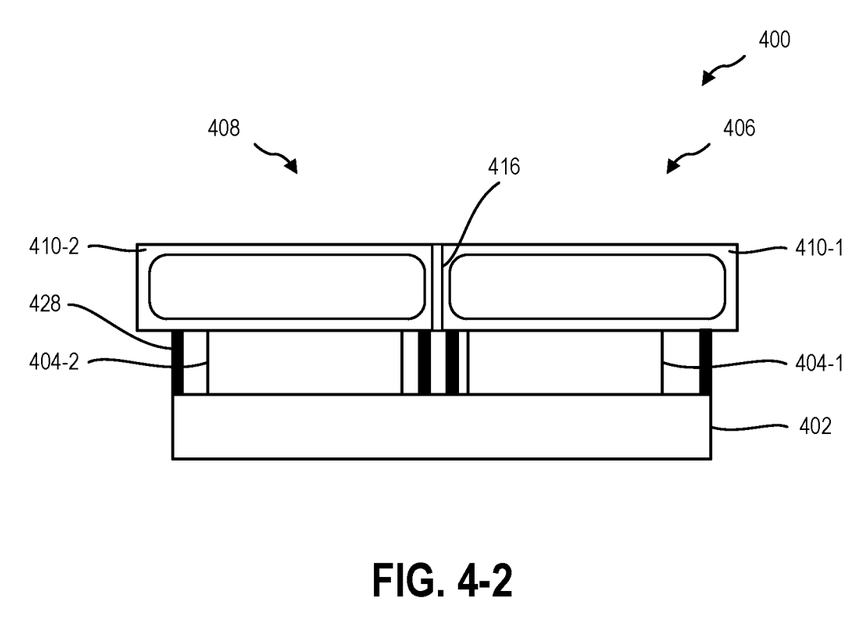

FIG. 4-2 is a schematic side-view of the cooling system 400 of FIG. 4-1. As may be seen, the plate supports 428 may secure the domains 410 to the base 402. For example, the plate supports 428 may extend from the domains 410 and into the base 402. During assembly, the cold plate 408 may be connected to the plate supports 428, such as by sliding the cold plate 408 onto the plate supports 428, snapping the cold plate 408 to the plate supports 428, or otherwise connecting the cold plate 408 to the base 402.

Figure 5:
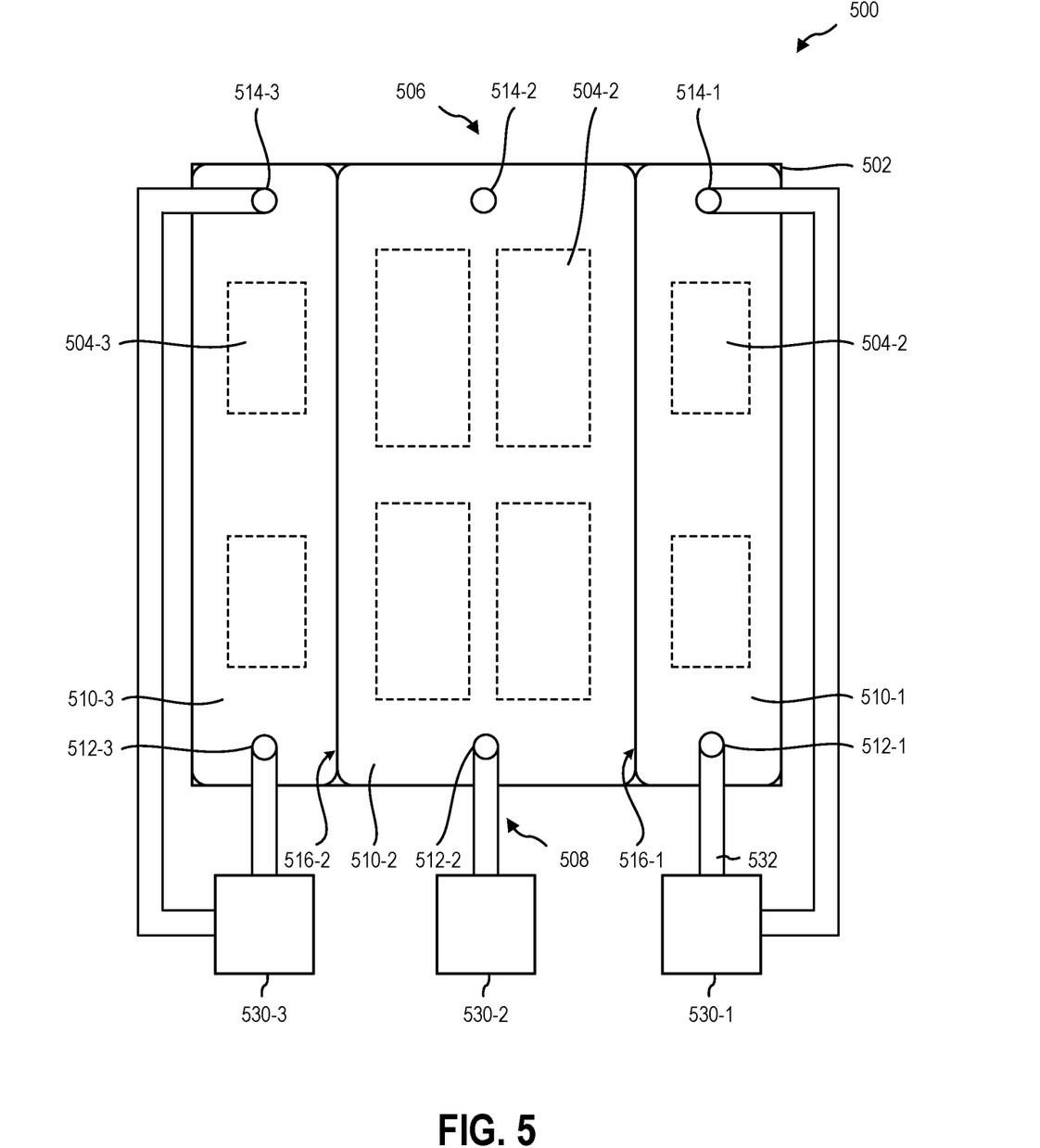
FIG. 5 is a schematic representation of a top-down view of a cooling system, according to at least one embodiment of the present disclosure.

FIG. 5 is a schematic representation of a top-down view of a cooling system 500, according to at least one embodiment of the present disclosure. The cooling system 500 shown includes a base 502, multiple heat-generating components (collectively 504), and a cooling system 506 thermally connected to the heat-generating components 504. The cooling system 506 includes a cold plate 508 having multiple domains (collectively 510). The domains 510 may be thermally connected to the heat-generating components 504. Cooling fluid may flow through the domains 510 of the cold plate 508. The domains 510 may be separated by thermal breaks (collectively 516).

In the embodiment shown, the cooling system 500 includes a first heat-generating component 504-1, a second heat-generating component 504-2, and a third heat-generating component 504-3. The heat-generating components 504 may have different heat generations. For example, at least two of the first heat-generating component 504-1, the second heat-generating component 504-2, and the third heat-generating component 504-3 may have different heat generations.

The cold plate 508 may include multiple domains 510. A first domain 510-1 may be thermally connected to the first heat-generating component 504-1, a second domain 510-2 may be thermally connected to the second heat-generating component 504-2, and a third domain 510-3 may be thermally connected to the third heat-generating component 504-3. While three types of heat-generating components 504 and three domains 510 are shown in FIG. 5, it should be understood that the cooling system 500 may include any number of heat generating components 504 and/or domains 510. In some embodiments, the number of domains 510 is equal to the number of heat-generating components 504. In some embodiments, the number of domains 510 is different from the number of heat-generating components 504. For example, a single domain 510 may cover multiple heat-generating components 504.

As discussed herein, the domains 510 may be thermally separated by thermal breaks 516. For example, the first domain 510-1 and the second domain 510-2 may be thermally separated by a first thermal break 516-1 and the second domain 510-2 and the third domain 510-3 may be separated by a second thermal break 516-2. This may help to insulate the domains 510 from each other's cooling systems or cooling fluids.

As discussed herein, cooling fluid may flow through the cold plate 508. In some embodiments, each domain has a separate fluid path. For example, a first fluid flow of a first cooling fluid may flow through the first domain 510-1 from a first inlet 512-1 to a first outlet 514-1. A second fluid flow of a second cooling fluid may flow through the second domain 510-2 from a second inlet 512-2 to a second outlet 514-2. A third fluid flow of a third cooling fluid may flow through the third domain 510-3 from a third inlet 512-3 to a third outlet 514-3.

As discussed herein, the cooling fluids may have different cooling fluid temperatures. The cooling fluids may originate from different sources (collectively 530) or fluid tanks. For example, the first cooling fluid may originate from a first fluid source 530-1, the second cooling fluid may originate from a second fluid source 530-2, and the third cooling fluid may originate from a third fluid source 530-3. Different fluid sources 530 may result in the inlets 512 of the domains 510 being fluidly separated. For example, the first inlet 512-1, the second inlet 512-2, and the third inlet 512-3 may be fluidly separated. Fluidly separated inlets 512 may not have any hydraulic path between them to allow a cooling fluid to flow from one to the other.

In some embodiments, two or more of the domains 510 may have cooling fluid flowing through them that originate from the same fluid source 530. For example, the first domain 510-1 and third domain 510-3 may have cooling fluid that originate from the same fluid source 530. This may result in the inlets 512 being fluidly connected.

Fluid may pass from the fluid sources 530 to the cold plate 508. For example, fluid may pass through tubing 532 from the fluid sources 530 to the cold plate 508. In some embodiments, the cooling fluid may be recirculated. For example, the cooling fluid may pass into the cold plate 508. Heat transfer from the heat-generating components 504 may warm the cooling fluid, and the warmed cooling fluid may return through the tubing 532 to the fluid sources 530. In some embodiments, the warmed cooling fluid may be chilled or cooled before the cooling fluid is recirculated through the cold plate 508. For example, a fluid source 530 may include a chiller which may cool the fluid to the cooling temperature. In some examples, the chiller may be separate from the fluid sources 530.

In some embodiments, the cooling fluid is not recirculated. For example, the warmed cooling fluid, after passing out of the cold plate 508, may be discarded, relocated to another process, or otherwise not recirculated.

As discussed herein, utilizing different fluid sources 530 may allow the cooling system 506 to use fluid sources that are tailored to the heat generation of the heat-generating components 504 in the associated domains. For example, a heat-generating component 504 having a higher operating temperature and/or a lower heat generation may be cooled by a cooling fluid having a higher cooling temperature. In some embodiments, one or more of the fluid sources 530 may not include a chiller. For example, tap water and/or other unchilled process water may be used to cool the heat-generating component 504 having the higher operating temperature. In some embodiments, the unchilled cooling fluid used in a particular domain 510 may include warmed cooling fluid from another domain 510. Such unchilled cooling fluid may reduce cooling operating costs. In some embodiments, the cooling operating costs are reduced by 3 times or more by utilizing unchilled cooling fluid.

Figure 6:
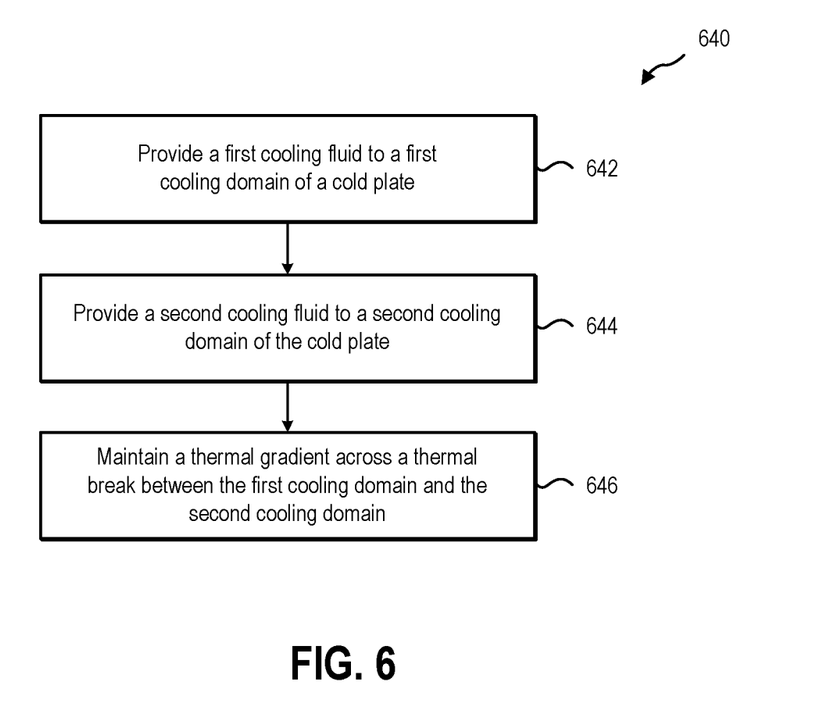
FIG. 6 is a flowchart of a method for cooling a computing system, according to at least one embodiment of the present disclosure.

FIG. 6 is a flowchart of a method 640 for cooling a computing system, according to at least one embodiment of the present disclosure. A cooling system may provide a first cooling fluid to a first domain of a cold plate at 642. The first domain may be thermally connected to a first heat-generating component of the computing device. The first heat-generating component may have a first power consumption, operating temperature, heat generation, and combinations thereof. The cooling system may provide a second cooling fluid to a second domain of the cold plate at 644. The second domain may be thermally connected to a second heat-generating component of the computing device. The second heat-generating component may have a second power consumption, operating temperature, heat generation, and combinations thereof, that is different from the first heat-generating component.

The cooling system may maintain a thermal gradient across a thermal break between the first domain and the second domain at 646. The thermal gradient being located across a thermal gap of 1 mm or less between the first domain and the second domain. As discussed herein, maintaining the thermal gradient may help allow the first domain and the second domain of the cold plate to have different cooling capacities.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A cold plate for use on a computing device, comprising:
   a first domain having a first inlet and a first outlet;
   a second domain having a second inlet and a second outlet; and
   a thermal break between the first domain and the second domain, the thermal break including a thermal gap separating the first domain and the second domain by 1 mm or less.

2. The cold plate of claim 1, wherein the thermal gap is filled with air.

3. The cold plate of claim 1, wherein the thermal gap includes a ceramic material.

4. The cold plate of claim 1, wherein the thermal gap includes stainless steel.

5. The cold plate of claim 1, wherein the cold plate includes a chassis, and wherein the first domain and the second domain are connected to the chassis.

6. The cold plate of claim 1, wherein the first inlet and the second inlet are fluidly separate.

7. The cold plate of claim 6, wherein the first inlet and the second inlet have different fluid sources.

8. The cold plate of claim 7, wherein a fluid source of the different fluid sources includes a chiller.

9. The cold plate of claim 1, wherein the first domain and the second domain are secured to the thermal break.

10. A computing system, comprising:
    a plurality of heat-generating components secured to a base, each heat-generating component of the plurality of heat-generating components having a different heat generation; and
    a cold plate including:
       a plurality of domains, each domain being associated with a heat-generating component of the plurality of heat-generating components; and
       a thermal break between two of the plurality of domains, the thermal break including a non-atmospheric-gas material means for insulating.

11. The computing system of claim 10, wherein the base includes a fixture, the plurality of domains being secured to the base at the fixture.

12. The computing system of claim 10, wherein the plurality of heat-generating components includes:
    a first heat-generating component having a first operating temperature;
    a second heat-generating component having a second operating temperature different from the first operating temperature; and
    wherein the plurality of domains includes:
       a first domain thermally connected to the first heat-generating component, the first domain having a first cooling capacity; and
       a second domain thermally connected to the second heat-generating component, the second domain having a second cooling capacity different than the first cooling capacity.

13. The computing system of claim 12, wherein the non-atmospheric-gas material means for insulating maintains a thermal gradient of greater than 30° C./mm.

14. The computing system of claim 12, wherein the first domain is connected to a first fluid source and the second domain is connected to a second fluid source.

15. The computing system of claim 14, wherein the first fluid source is unchilled.

16. The computing system of claim 12, wherein the first cooling capacity maintains the first heat-generating component at the first operating temperature while the second cooling capacity maintains the second heat-generating component at the second operating temperature.

17. The computing system of claim 12, wherein the first heat-generating component includes a high-bandwidth memory.

18. A method for cooling a computing device, comprising:
    providing a first cooling fluid to a first domain of a cold plate, the first domain thermally connected to a first heat-generating component;
    providing a second cooling fluid to a second domain of the cold plate, the second domain thermally connected to a second heat-generating component; and
    maintaining a thermal gradient across a thermal break between the first domain and the second domain, the thermal gradient being located across a thermal gap of 1 mm or less between the first domain and the second domain.

19. The method of claim 18, wherein providing the first cooling fluid includes providing the first cooling fluid from an unchilled fluid source.

20. The method of claim 18, wherein maintaining the thermal gradient includes maintaining the thermal gradient of greater than 30° C.

* * * * *